US010299397B1

(12) United States Patent
Chen et al.

(10) Patent No.: US 10,299,397 B1
(45) Date of Patent: May 21, 2019

(54) AUTO-LOCK MECHANISM

(71) Applicant: Quanta Computer Inc., Taoyuan (TW)

(72) Inventors: Chao-Jung Chen, Taoyuan (TW); Chih-Hsiang Lee, Taoyuan (TW); Kun-Pei Liu, Taoyuan (TW); Yi-Te Chang, Taoyuan (TW)

(73) Assignee: Quanta Computer Inc., Taoyuan (TW)

( * ) Notice: Subject to any disclaimer, the term of this patent is extended or adjusted under 35 U.S.C. 154(b) by 0 days.

(21) Appl. No.: 15/914,126

(22) Filed: Mar. 7, 2018

(51) Int. Cl.
*H05K 1/14* (2006.01)
*H05K 5/02* (2006.01)
*H05K 7/14* (2006.01)

(52) U.S. Cl.
CPC ......... *H05K 5/0221* (2013.01); *H05K 7/1417* (2013.01); *H05K 7/1429* (2013.01)

(58) Field of Classification Search
CPC ... H05K 5/0221; H05K 7/1417; H05K 7/1429
USPC ....................................... 361/740
See application file for complete search history.

(56) References Cited

U.S. PATENT DOCUMENTS

| 4,927,111 A * | 5/1990 | Takahashi | H05K 7/1417 211/41.17 |
|---|---|---|---|
| 6,320,743 B1 * | 11/2001 | Jin | G06F 1/1616 361/679.08 |
| 2002/0048155 A1 * | 4/2002 | Chiang | G06F 1/1616 361/747 |
| 2004/0121636 A1 * | 6/2004 | Lai | H01R 12/7029 439/153 |

* cited by examiner

*Primary Examiner* — Hung S. Bui
(74) *Attorney, Agent, or Firm* — Nixon Peabody LLP; Zhou Lu

(57) ABSTRACT

A locking mechanism for securing a component card to a main board is provided and includes a base having a top portion with a beveled edge and a coupling portion engageable with the main board. The locking mechanism includes a sliding element slidably, coupled to the base, having an extended protrusion. The sliding element is slidable between a locked and an unlocked position, where the protrusion is displaced towards the base in the unlocked position. The locking mechanism includes a biasing element between the base and the sliding element within a protuberance opposite the protrusion. The biasing element urges the sliding element toward the locked position. The protuberance includes an aperture formed at an end opposite the protrusion and allows a portion of the biasing element to pass through. In the locked position, a bottom surface of the protrusion and a top surface of the base define a receiving space.

16 Claims, 16 Drawing Sheets

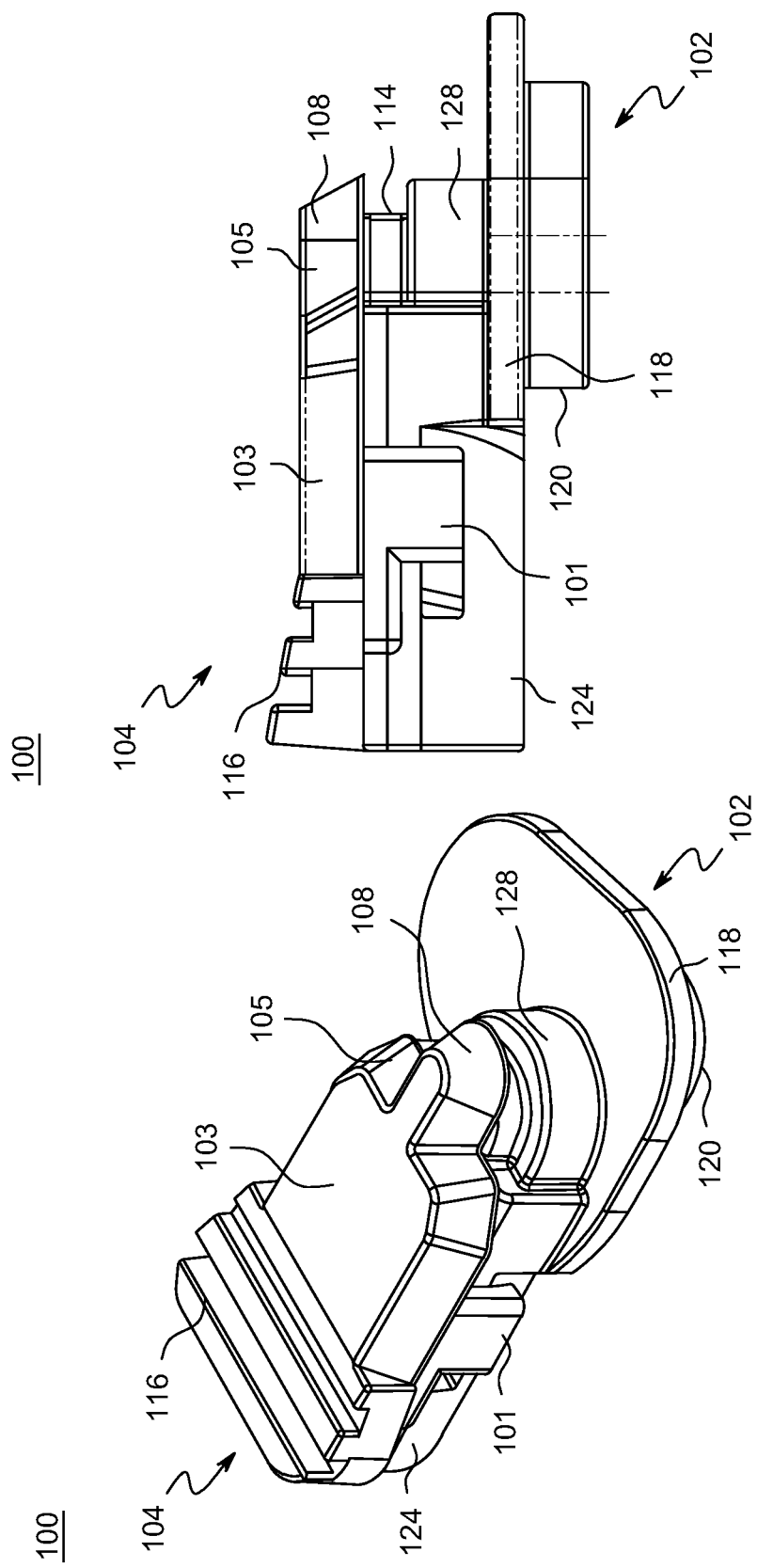

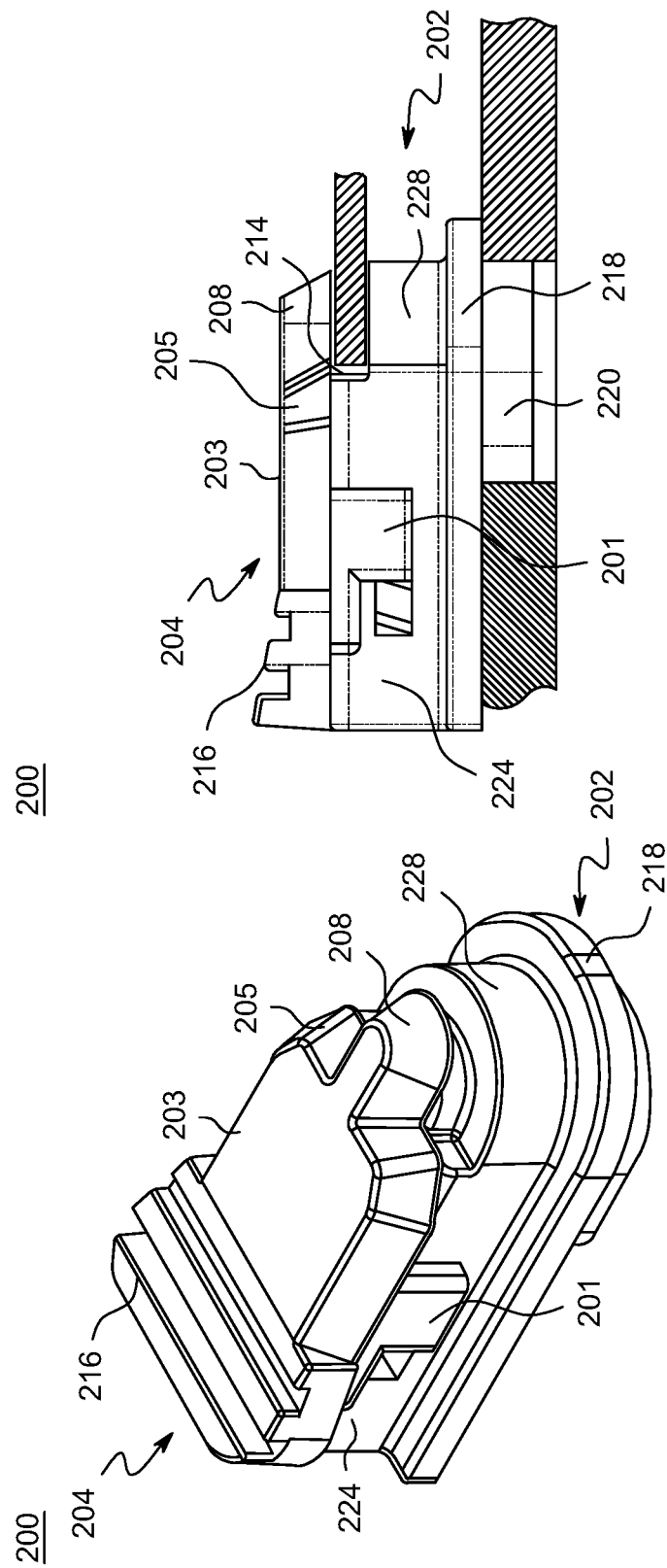

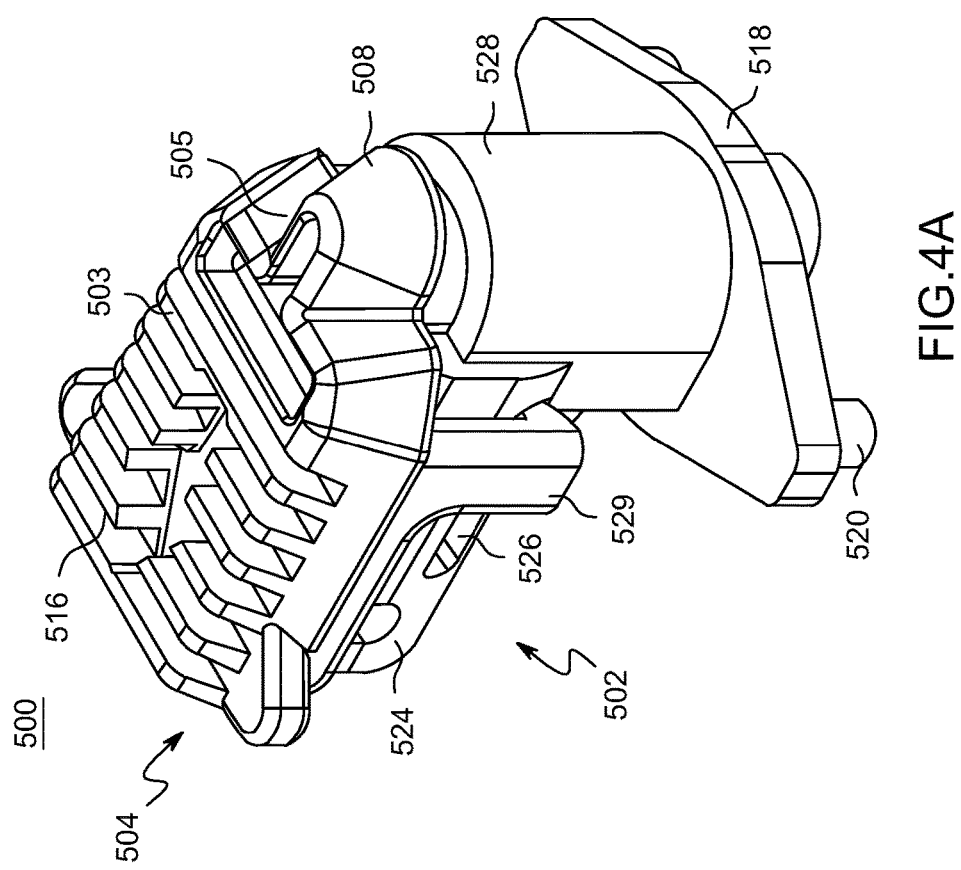

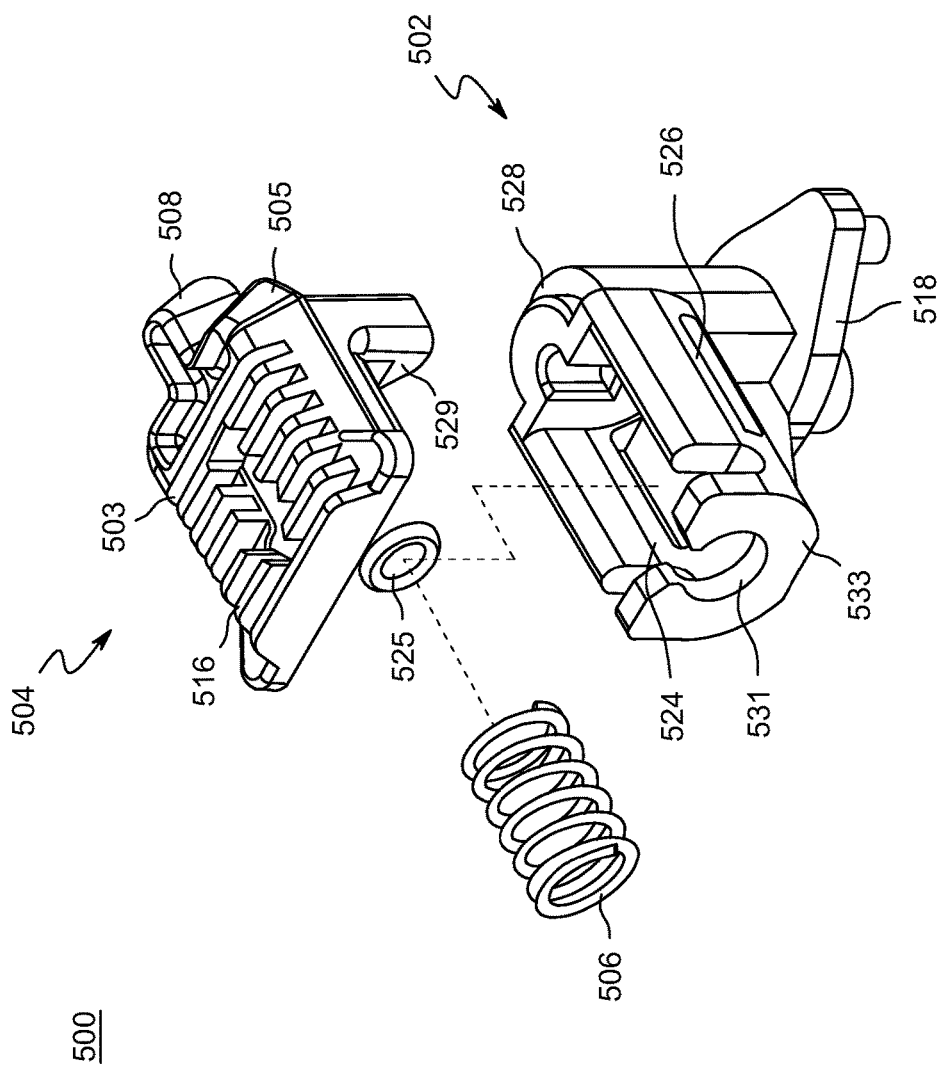

AUTO-LOCK MECHANISM

FIELD OF THE INVENTION

The present disclosure generally relates to an auto-lock mechanism. More specifically, the present disclosure relates to an auto-lock mechanism configured to securely couple a component card to a main board.

BACKGROUND

Component cards, such as M.2 cards, are configured to be coupled to a main board and are often installed, released, replaced, and/or otherwise uncoupled from the main board for any number of reasons, such as maintenance. Existing mechanisms that secure component cards to a main board require a user to engage and/or disengage one or more coupling mechanisms to secure the component card to the main board. Users may often have need to add or replace a component card to the main board. As such, an efficient lock mechanism is needed.

SUMMARY

A locking mechanism for securing a component card to a main board is provided. The locking mechanism includes a base having a top portion with a beveled edge and a coupling portion engageable with the main board. The locking mechanism also includes a sliding element slidably coupled to the base, the sliding element having an extended protrusion. The sliding element is slidable between a locked position and an unlocked position, where the protrusion is displaced towards the base in the unlocked position. The locking mechanism also includes a biasing element between the base and the sliding element within a protuberance opposite the protrusion. The biasing element urges the sliding element toward the locked position. The protuberance includes an aperture formed at an end opposite to the protrusion and configured to allow at least a portion of the biasing element to pass through. The base and the sliding element are arranged so that in the locked position, a bottom surface of the protrusion and a top surface of the base define a receiving space.

The locking mechanism can include a handle portion formed on the sliding element opposite the protrusion. The handle portion is configured to assist sliding between the locked position and the unlocked position. In some embodiments, the coupling portion can include at least one securing element configured to be disposed through an aperture formed in the main board. The securing element forms a pressure fit with the aperture. In some embodiments, a tab can extend from the coupling portion, where the tab is configured to abut a top surface of the main board as the securing element is disposed through an aperture formed in the main board.

In some embodiments, the protuberance can include a spring receiving portion disposed within the base. The sliding element can include a spring guide disposed within the spring receiving portion. This configuration can form an annulus between the spring guide and the spring receiving portion. In some embodiments, the spring can be disposed within the annulus and coupled with the sliding element. In some embodiments, the aperture formed at the end opposite the protrusion is configured to allow at least a portion of the spring guide to pass through.

In some embodiments of the disclosure, the component card is an M.2 card having a substantially semicircular notch. The notch is receivable into a correspondingly shaped receiving space defined between the sliding element and the base. Furthermore, the sliding element can include at least one tab configured to engage with a track formed on the base, where one end of the track corresponds to the locked position and another end opposite the one end corresponds to the unlocked position.

BRIEF DESCRIPTION OF THE DRAWINGS

In order to describe the manner in which the above-recited disclosure and its advantages and features can be obtained, a more particular description of the principles briefly described above will be rendered by reference to specific examples illustrated in the appended drawings. These drawings depict only exemplary embodiments, and are therefore not to be considered to be limiting of the scope of the various embodiments or the claims. The principles are described and explained with additional specificity and detail through the use of the following drawings.

FIG. 1A is an isometric view of an example embodiment of a locking mechanism in accordance with the present disclosure;

FIG. 1B is a side view of the example embodiment of a locking mechanism of FIG. 1A;

FIG. 2A is an isometric view of an example embodiment of a locking mechanism in accordance with the present disclosure;

FIG. 2B is a side view of the example embodiment of a locking mechanism of FIG. 2A;

FIG. 4A is an isometric view of an example embodiment of a locking mechanism in accordance with the present disclosure;

FIG. 4C is a base-rear isometric exploded view of the example embodiment of a locking mechanism of FIG. 4A;

DETAILED DESCRIPTION

Figure 1C:
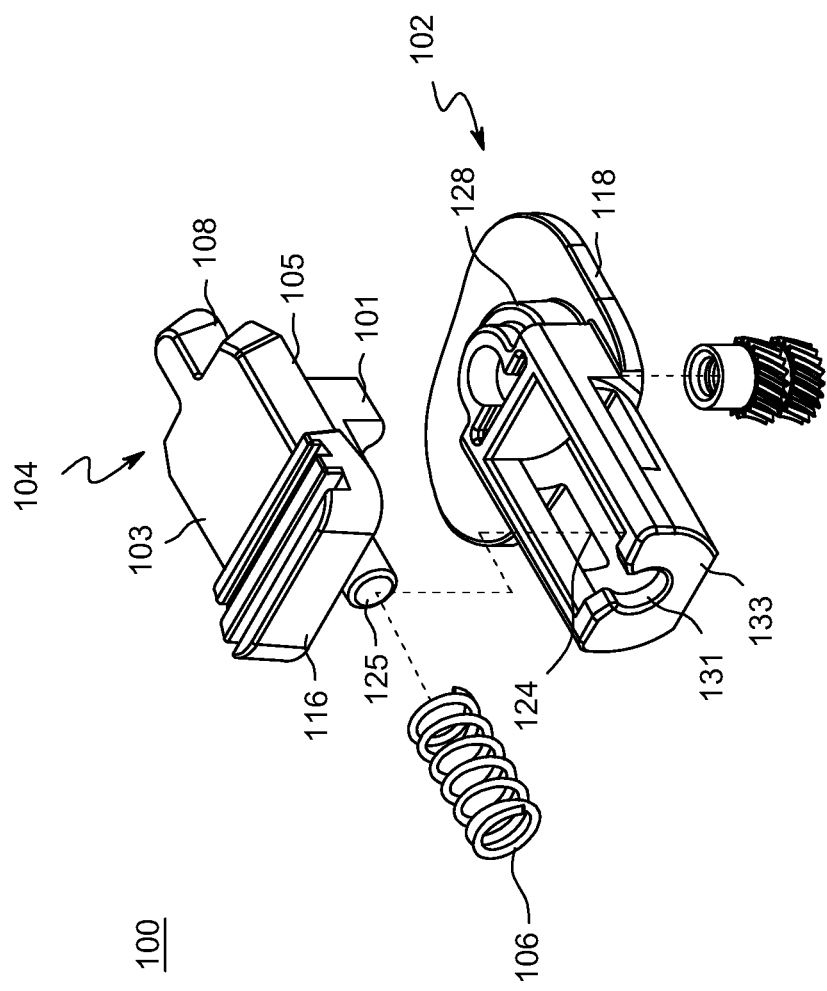
FIG. 1C is a base-rear isometric exploded view of the example embodiment of a locking mechanism of FIG. 1A.

The various embodiments are described with reference to the attached figures, wherein like reference numerals are used throughout the figures to designate similar or equivalent elements. The figures are not drawn to scale, and are provided merely to illustrate the various embodiments. Several embodiments are described below with reference to example applications for illustration. It should be understood that numerous specific details, relationships, and methods are set forth to provide a full understanding of the various embodiments. One having ordinary skill in the relevant art, however, will readily recognize that the various embodiments can be practiced without one or more of the specific details or with other methods. In other instances, well-known structures or operations are not shown in detail to avoid obscuring certain aspects of the various embodiments. The various embodiments are not limited by the illustrated ordering of acts or events, as some acts may occur in different orders and/or concurrently with other acts or events. Furthermore, not all illustrated acts or events are required to implement a methodology in accordance with the various embodiments.

Several definitions that apply throughout this disclosure will now be presented. The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series, and the like.

The present disclosure relates to a locking mechanism for securing a component card to a main board. The locking mechanism includes a base with a top portion. The top portion includes a beveled edge and a coupling portion engageable with the main board. The locking mechanism also includes a sliding element slidably coupled to the base. The sliding element has an extended protrusion. The sliding element is slidable between a locked position and an unlocked position, where the protrusion is displaced towards the base in the unlocked position. The locking mechanism also includes a biasing element between the base and the sliding element within a protuberance opposite the protrusion. The biasing element urges the sliding element toward the locked position. The protuberance includes an aperture formed at an end opposite to the protrusion, and is configured to allow at least a portion of the biasing element to pass through. The base and the sliding element are arranged so that in the locked position, a bottom surface of the protrusion and a top surface of the base define a receiving space.

FIGS. 1A, 1B, and 1C illustrate an example embodiment of a locking mechanism 100 according to the present disclosure. The locking mechanism 100 can have a base 102, a sliding element 104, and a biasing element 106. The sliding element 104 can be slidably disposed on the base 102 and has a protrusion 108 extending therefrom. The protrusion 108 can be a portion of the sliding element 104 that extends in one direction. The sliding element can also include a top surface 103 with a beveled edge 105. The base 102 can have a coupling portion 118 configured to secure the locking mechanism 100 to a main board (not shown). This is discussed in greater detail with respect to FIGS. 6-9.

The sliding element 104 can be transitioned between a locked position and an unlocked position. The unlocked position can be seen more clearly in FIG. 8, while the locked position can be seen clearly in FIGS. 1A and 1B. The biasing element 106 can hold the locking mechanism 100 in the locked position. The unlocked position can have the protrusion 108 displaced toward a support 128 of the base 102 relative to the locked position. As can be appreciated with respect to FIGS. 6-9, discussed in more detail below, the unlocked position displaces the sliding element 104 and the protrusion 108 so as to allow a component card (as discussed below in greater detail with respect to FIG. 6) to be coupled and/or decoupled from the locking mechanism. As can be appreciated in FIG. 1B, a bottom surface of the protrusion 108 and a top surface of the base 102 can collectively form a receiving portion 114. The receiving portion 114 can have be configured to receive a notch of a component card (as discussed below) with respect to FIGS. 6-9.

The locking mechanism 100 can also have a handle portion 116 formed on the sliding element 104 and disposed opposite the protrusion 108. The handle portion 116 can assist in transitioning the locking mechanism 100 between the locked position and the unlocked position. The handle portion 116 can be operably engaged to guide the sliding element 104 while simultaneously compressing the biasing element 106 to transition the locking mechanism 100 between the locked position and the unlocked position. The beveled edge 105 of the sliding element 104 can be configured to transition the locking mechanism 100 to an unlocked position as a component card (as discussed below in greater detail with respect to FIG. 6) abuts the beveled edge 105. The component card can abut the beveled edge 105, causing the component card to slide down the beveled edge 105. This contact causes the sliding portion 104 to apply a force against biasing element 106. The force then compresses the biasing element 106 and thus the locking mechanism 100 transitions from the locked position to the unlocked position. This is discussed in greater detail with respect to FIG. 7. The beveled edge 105 can be a beveled portion, or sloped portion disposed on the protrusion 108. In some instances, the sliding element 104 can have a handle portion 116, a slanted portion, or any combination thereof.

The biasing element 106 can be disposed between the base 102 and the sliding element 104 and configured to urge the sliding element 104 toward a locked position. Compression of the biasing element 106 by sliding of the sliding element 104 can transition the locking mechanism 100 to an unlocked position. While the illustrated embodiments utilize a coil spring biasing element 106, the locking mechanism 100 can be implemented with one or more biasing elements 106 including, but not limited to, a torsion spring, a linear actuator, or a deformable material configured to return to its original shape upon release of a compression force. In some instances, the biasing element 106 can be omitted and the sliding element 104 can be secured in the locked position by a notch, pin, screw, or other securement mechanism.

The base 102 further includes a coupling portion 118 engageable with a main board (as discussed below in greater detail with respect to FIGS. 6-9). The coupling portion 118 is connected to the body of the base 102. In some embodiments, the coupling portion 118 and the base 102 form a unibody structure. In other embodiments, the coupling portion 118 and the base 102 are connected by molding, welding, stamping, extrusion, brass, CNC, or any other available shaping process. The coupling portion 118 can have a securing element 120 configured to be disposed through an aperture (not shown) formed on the main board (as discussed below in greater detail with respect to FIGS. 6-9). The securing element 120 and the aperture (not shown) can have corresponding circumferences (where the aperture is slightly larger) that allows for a perfect fit between the two parts. In other embodiments, the securing element 120 and the aperture (not shown) can have an interference fit—where the condition of fit (contact) between the two parts requires pressure to force the parts together. The coupling portion 118 can extend from the securing element 120 such that it is configured to abut and engage a top surface of the main board when the displaceable element 120 is disposed through the aperture. The coupling portion 118 can secure the locking mechanism 100 to the main board allowing the component card to received and secured by the locking mechanism 100.

As shown in FIG. 1C, the locking mechanism 100 is provided in a base-rear isometric exploded view. In some embodiments, the biasing element 106 can include a spring. A spring receiving portion 124 can be disposed within the base 102 and configured to receive a spring biasing element 106 and coupled with the sliding element 104. The spring receiving portion 124 can be a protuberance extending opposite the protrusion 108 and configured to receive the spring therein. The sliding element 104 can have a spring guide tube 125 received within the spring receiving portion 124 and around which the biasing element 106 can be disposed. The spring guide tube 125 can allow smooth compression and expansion of the biasing element 106, while preventing the biasing element 106 of compressing or deflecting in a direction inconsistent with transitioning of the locking mechanism 100 between the locked and unlocked position.

The spring receiving portion 124 can have an aperture 131 in the back surface 133 allowing the spring guide tube 125 to extend through as the sliding element 104 is transitioned to the unlocked position. The aperture 131 allows for quick access to the spring receiving portion 124 for repairs and installation. Moreover, the aperture 131 allows for simplicity in manufacturing the components of the locking mechanism 100. In at least one embodiment, the protuberance is a hollow tube having a coil spring received within the tube.

A tab portion 101 of the sliding element 104 can be received within the spring receiving portion 124 to allow the sliding element 104 to transition on the base 102 between the locked position and the unlocked position. The tab portion 101 can slide from one end corresponding to the locked position to an opposite end corresponding to the unlocked position. The tab portion 101 within the spring receiving portion 124 can extend from the sliding element 104 toward the spring guide tube 125. The tab portion 101 is configured to guide the sliding element 104 along the base 102. In some instances, the tab portion 101 can couple the spring guide tube 125 with the sliding element 104, and the tab portion 101 coupled with the spring guide tube 125 being utilized to compress the biasing element 106 as the locking mechanism transitions from the locked position to the unlocked position.

As the sliding element 104 transitions from the locked position to the unlocked position, the tab portion 101 moves from one end of the spring receiving portion 124 to the opposing end, compressing the biasing element 106. The tab portion 101 can slide within the spring receiving portion 124 along a track (not shown). The track (not shown) can be a groove having a predetermined depth but not extending through the base 102. In some embodiments, the track 126 can be formed in the upper surface of the spring receiving portion 124 and allowing the tab portion (not shown) to extend directly from the sliding element 104.

Figure 2C:
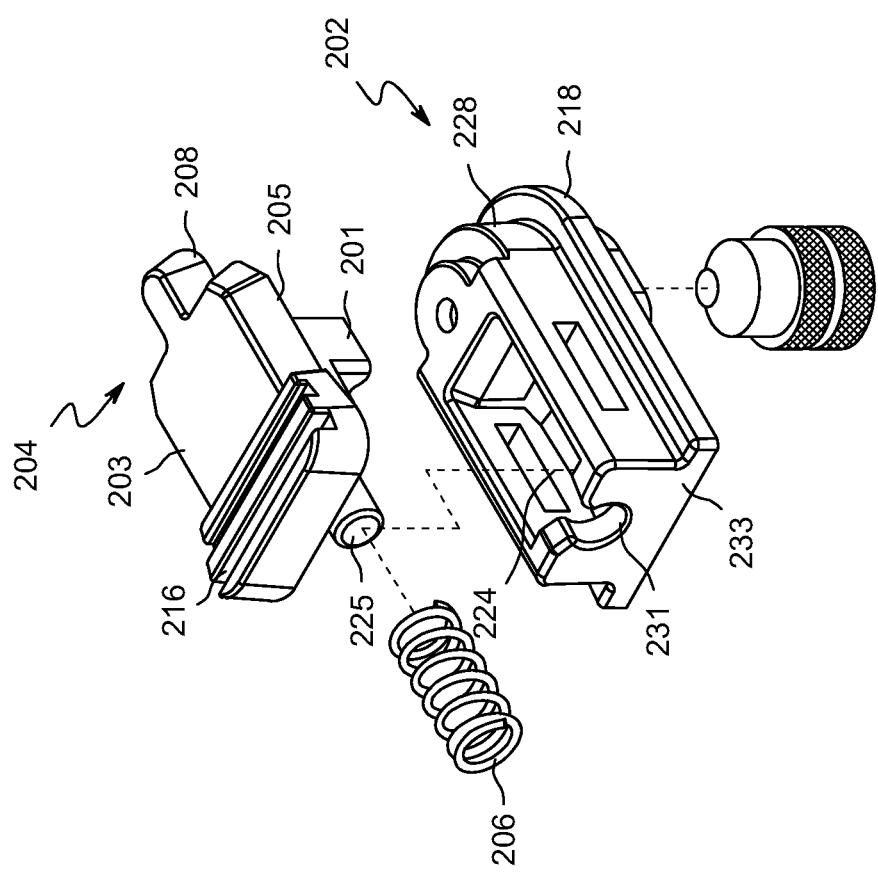
FIG. 2C is a base-rear isometric exploded view of the example embodiment of a locking mechanism of FIG. 2A.

FIGS. 2A, 2B, and 2C illustrate an example embodiment of a locking mechanism 200 according to the present disclosure. The locking mechanism 200 can have a base 202, a sliding element 204, and a biasing element 206 located within the base 202. The sliding element 204 can be slidably disposed on the base 202, and has a protrusion 208 extending therefrom. The protrusion 208 can be a portion of the sliding element 204 that extends in one direction. The sliding element can also include a top surface 203 with a beveled edge 205. The base 202 can have a coupling portion 218 configured to secure the locking mechanism 200 to a main board (not shown). This is discussed in greater detail with respect to FIGS. 6-9.

As detailed with respect to locking mechanism 100, the sliding element 204 can be transitioned between a locked position and an unlocked position. The biasing element (not shown) located within the base 202 can hold the locking mechanism 200 in the locked position. The unlocked position can have the protrusion 208 displaced toward a support 228 of the base 202 relative to the locked position. As can be appreciated in FIG. 2B, a bottom surface of the protrusion 208 and a top surface of the base 202 can collectively form a receiving portion 214. The receiving portion 214 can be configured to receive a notch of a component card, as discussed below with respect to FIGS. 6-9.

The locking mechanism 200 can also have a handle portion 216 formed on the sliding element 204 and disposed opposite the protrusion 208. The handle portion 216 can assist in transitioning the locking mechanism 200 between the locked position and the unlocked position. The handle portion 216 can be operably engaged to guide the sliding element 204 while simultaneously compressing the biasing element 206 located within the base 202 to transition the locking mechanism 200 between the locked position and the unlocked position. The beveled edge 205 of the sliding element 204 can be configured to transition the locking mechanism 200 to an unlocked position as a component card (as discussed below in greater detail with respect to FIG. 6) abuts the beveled edge 205. The component card can abut the beveled edge 205, thereby causing the component card to slide down the beveled edge 205. This contact causes the sliding element 204 to apply a force against biasing element 206. The force then compresses the biasing element 206, and thus the locking mechanism 200 transitions from the locked position to the unlocked position. This is discussed in greater detail with respect to FIG. 7. The beveled edge 205 can be a beveled portion, or sloped portion disposed on the protrusion 208. In some embodiments of the disclosure, the sliding element 204 can have a handle portion 216, a slanted portion, or any combination thereof.

The biasing element 206 located within the base 202 can configured to urge the sliding element 204 toward a locked position. Specifically, a spring receiving portion 224 can be disposed within the base 202 to receive the biasing element. Compression of the biasing element 206 by sliding of the sliding element 204 can transition the locking mechanism 200 to an unlocked position. The base 202 further includes a coupling portion 218 engageable with a main board (as discussed below in greater detail with respect to FIGS. 6-9). The coupling portion 218 can encapsulate the full length of the base 202 of the locking mechanism 200. In locking mechanism 200, the coupling portion 218 does not extend much further from the body of the base 202. This creates a more durable base 202. Furthermore, the coupling portion 218 and the base 202 can be formed as a unibody structure, thereby reducing the costs for manufacture and design. The coupling portion 218 can have a securing element 220 configured to be disposed through an aperture (not shown) formed on the main board (as discussed below in greater detail with respect to FIGS. 6-9). The securing element 220 and the aperture (not shown) can have corresponding circumferences (where the aperture is slightly larger) that allows for a perfect fit between the two parts. In other embodiments, the securing element 220 and the aperture (not shown) can have an interference fit—where the condition of fit (contact) between the two parts requires pressure to force the parts together. The coupling portion 218 can extend from the securing element 220 such that it is configured to abut and engage a top surface of the main board when the displaceable element 220 is disposed through the aperture. The coupling portion 218 can secure the locking mechanism 200 to the main board, thereby allowing the component card to received and secured by the locking mechanism 200.

As shown in FIG. 2C, the locking mechanism 200 is provided in a base-rear isometric exploded view. In some embodiments, the biasing element 206 can include a spring. A spring receiving portion 224 can be disposed within the base 202 and configured to receive a spring biasing element 206 and coupled with the sliding element 204. The spring receiving portion 224 can be a protuberance extending opposite the protrusion 208 and configured to receive the spring therein. The sliding element 204 can have a spring guide tube 225 received within the spring receiving portion 224 and around which the biasing element 206 can be disposed. The spring guide tube 225 can allow smooth compression and expansion of the biasing element 206, while preventing the biasing element 206 of compressing or deflecting in a direction inconsistent with transitioning of the locking mechanism 200 between the locked and unlocked position.

The spring receiving portion 224 can have an aperture 231 in the back surface 233 allowing the spring guide tube 225 to extend through as the sliding element 204 is transitioned to the unlocked position. The aperture 231 allows for quick access to the spring receiving portion 224 for repairs and installation. Moreover, the aperture 231 allows for simplicity in manufacturing the components of the locking mechanism 200. In at least one embodiment, the protuberance is a hollow tube having a coil spring received within the tube.

A tab portion 201 of the sliding element 204 can be received within the spring receiving portion 224 to allow the sliding element 204 to transition between the locked position and the unlocked position. The tab portion 201 can slide from one end corresponding to the locked position to an opposite end corresponding to the unlocked position. The tab portion 201 is configured to guide the sliding element 204 along the base 202. As the sliding element 204 transitions from the locked position to the unlocked position, the tab portion 201 can move from one end of the spring receiving portion 224 to the opposing end, compressing the biasing element 206. The tab portion 201 can slide within the spring receiving portion 224 along a track (not shown).

Figure 3B:
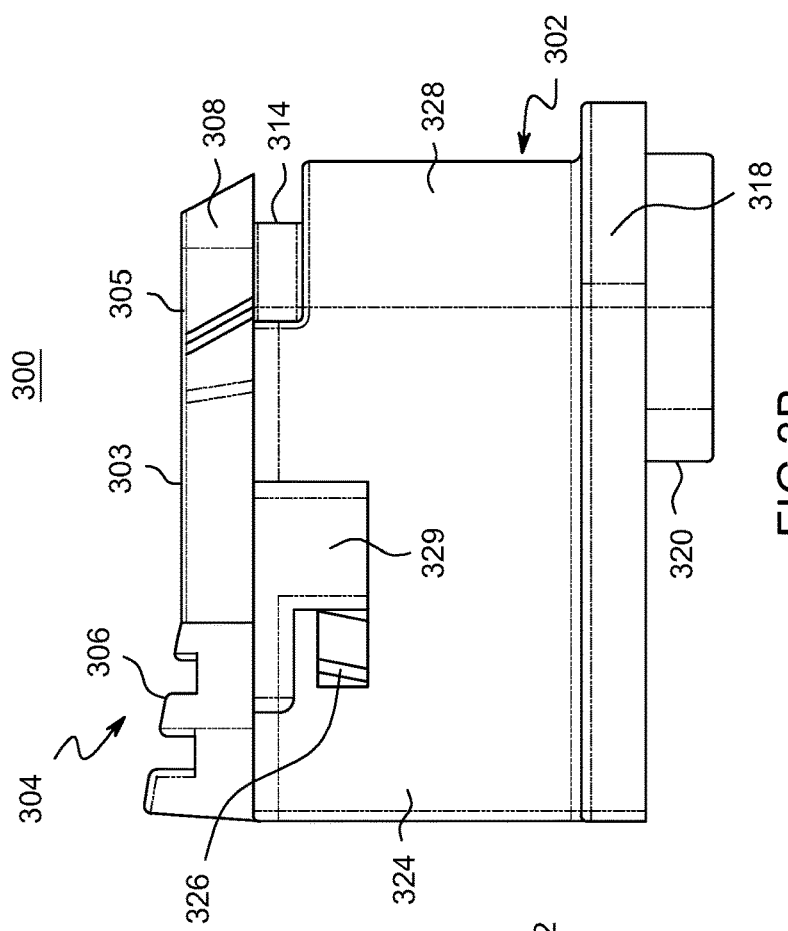
FIG. 3B is a side view of the example embodiment of a locking mechanism of FIG. 3A.
Figure 3A:
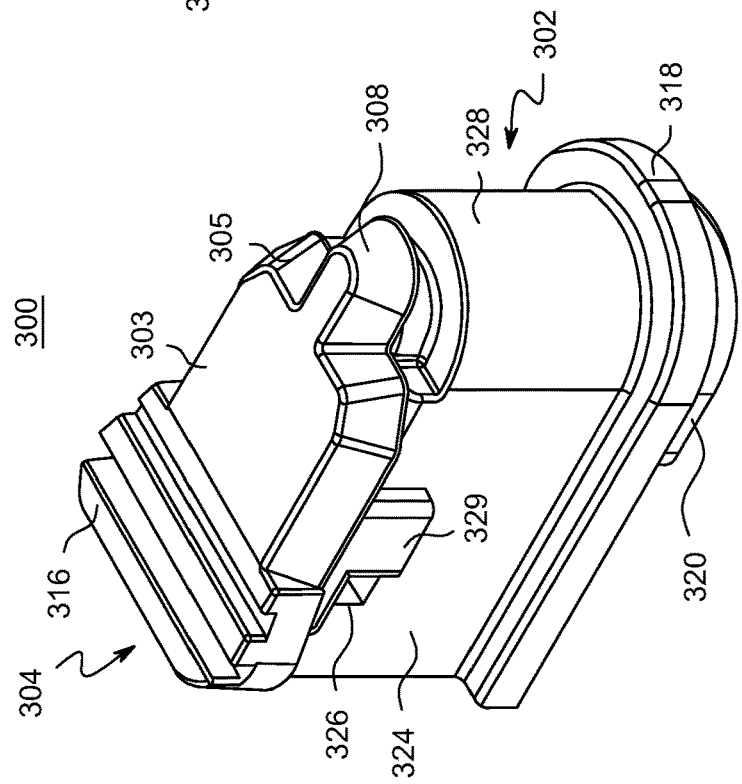
FIG. 3A is an isometric view of an example embodiment of a locking mechanism in accordance with the present disclosure.
Figure 3C:
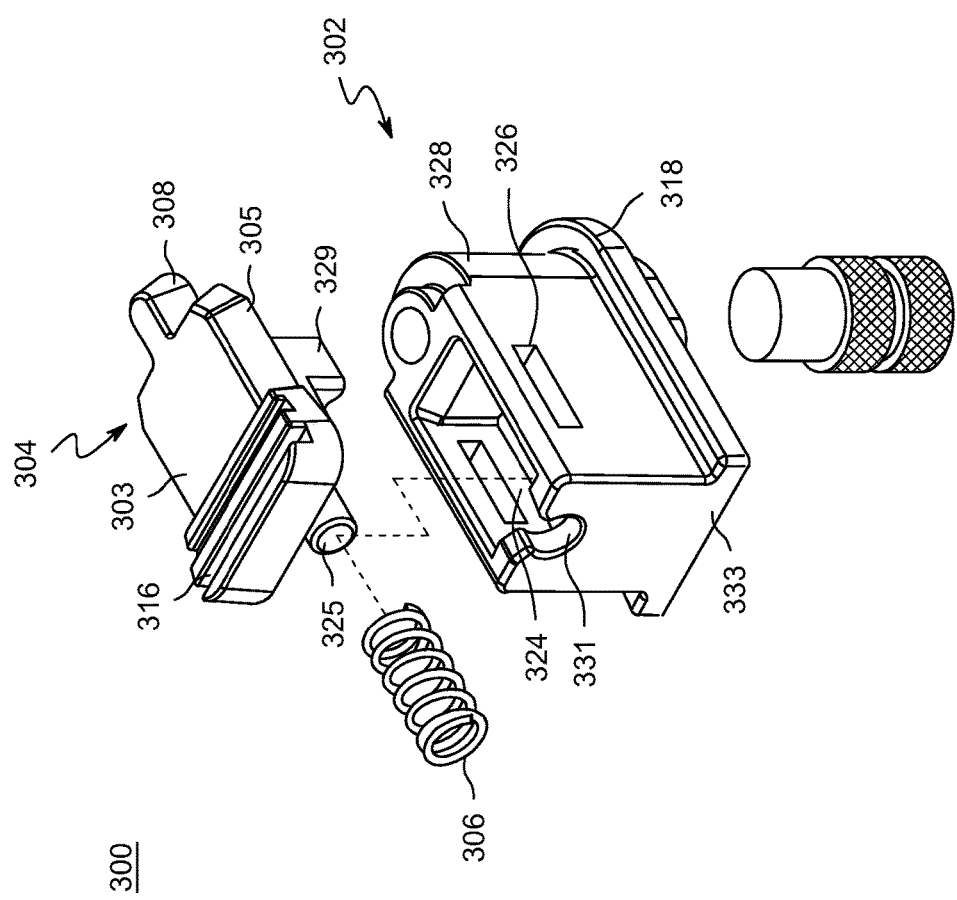
FIG. 3C is a base-rear isometric exploded view of the example embodiment of a locking mechanism of FIG. 3A.

FIGS. 3A, 3B, and 3C illustrate an example embodiment of a locking mechanism 300 according to the present disclosure. The locking mechanism 300 can have a base 302, a sliding element 304, and a biasing element 306 located within the base 302. The sliding element 304 can be slidably disposed on the base 302, and has a protrusion 308 extending therefrom. The protrusion 308 can be a portion of the sliding element 304 that extends in one direction. The sliding element 304 can also include a top surface 303 with a beveled edge 305. The base 302 can have a coupling portion 318 configured to secure the locking mechanism 300 to a main board (not shown). This is discussed in greater detail with respect to FIGS. 6-9.

The sliding element 304 can be transitioned between a locked position and an unlocked position. The biasing element 306 located within the base 302 can hold the locking mechanism 300 in the locked position. The unlocked position can have the protrusion 308 displaced toward a support 328 of the base 302 relative to the locked position. As can be appreciated in FIG. 3B, a bottom surface of the protrusion 308 and a top surface of the base 302 can collectively form a receiving portion 314. The receiving portion 314 can be configured to receive a notch of a component card (as discussed below with respect to FIGS. 6-9).

The locking mechanism 300 can also have a handle portion 316 formed on the sliding element 304 and disposed opposite the protrusion 308. The handle portion 316 can assist in transitioning the locking mechanism 300 between the locked position and the unlocked position. The handle portion 316 can be operably engaged to guide the sliding element 304 while simultaneously compressing the biasing element 306 located within the base 302 to transition the locking mechanism 300 between the locked position and the unlocked position. The beveled edge 305 of the sliding element 304 can be configured to transition the locking mechanism 300 to an unlocked position as a component card (as discussed below in greater detail with respect to FIG. 6) abuts the beveled edge 305. The component card can abut the beveled edge 305, causing the component card to slide down the beveled edge 305. This contact causes the sliding element 304 to apply a force against biasing element (not shown). The force then compresses the biasing element 306, and thus the locking mechanism 300 transitions from the locked position to the unlocked position. This is discussed in greater detail with respect to FIG. 7. The beveled edge 305 can be a beveled portion, or sloped portion disposed on the protrusion 308. In some embodiments of the disclosure, the sliding element 304 can have a handle portion 316, a slanted portion, or any combination thereof.

The biasing element 306 located within the base 302 can configured to urge the sliding element 304 toward a locked position. Specifically, a spring receiving portion 324 can be disposed within the base 302 to receive the biasing element. Compression of the biasing element 306 by sliding of the sliding element 304 can transition the locking mechanism 300 to an unlocked position. The base 302 further include a coupling portion 318 engageable with a main board (as discussed below in greater detail with respect to FIGS. 6-9). In locking mechanism 300, the coupling portion 318 does not extend much further from the body of the base 302. The coupling portion 318 can encapsulate the full length of the base 302 of the locking mechanism 300. This creates a more durable base 302. Furthermore, the coupling portion 318 and the base 302 can be formed as a unibody structure reducing the costs for manufacture and design. The coupling portion 318 can have a securing element 320 configured to be disposed through an aperture (not shown) formed on the main board (as discussed below in greater detail with respect to FIGS. 6-9).

The securing element 320 and the aperture (not shown) can have corresponding circumferences (where the aperture is slightly larger) that allows for a perfect fit between the two parts. In other embodiments, the securing element 320 and the aperture (not shown) can have an interference fit—where the condition of fit (contact) between the two parts requires pressure to force the parts together. The coupling portion 318 can extend from the securing element 320 such that it is configured to abut and engage a top surface of the main board when the displaceable element 320 is disposed through the aperture. The coupling portion 318 can secure the locking mechanism 300 to the main board, therefore allowing the component card to received and secured by the locking mechanism 300.

The biasing element 306 can be disposed between the base 302 and the sliding element 304, and configured to urge the sliding element 304 toward a locked position. Compression of the biasing element 306 by sliding of the sliding element 304 can transition the locking mechanism 300 to an unlocked position. In at least one embodiment, the biasing element 306 is a spring. A spring receiving portion 324 can be disposed within the base 302 and configured to receive a spring biasing element 306. The spring biasing element 306 can be coupled with the sliding element 304. The spring receiving portion 324 can be a protuberance extending opposite the protrusion 308 and configured to receive the spring therein. The sliding element 304 can have a spring guide tube 325 received within the spring receiving portion 324 and around which the biasing element 306 can be disposed. The spring guide tube 325 and the spring receiving portion 324 can form an annulus within which the biasing element 306 is received. The spring guide tube 325 can allow smooth compression and expansion of the biasing element 306, while preventing the biasing element 306 from compressing or deflecting in a direction inconsistent with transitioning of the locking mechanism 300 between the locked and unlocked position.

The spring receiving portion 324 can have an aperture 331 in the back surface 333 allowing the spring guide tube 325 to extend through as the sliding element 304 is transitioned to the unlocked position. The aperture 331 allows for quick access to the spring receiving portion 324 for repairs and installation. Moreover, the aperture 331 allows for simplicity in manufacturing the components of the locking mechanism 300. In at least one embodiment, the protuberance is a hollow tube having a coil spring received within the tube.

The base 302 can have at least a portion of the sliding element 304 received within a track 326 allowing the sliding element 304 to transition on the base 302 between the locked position and the unlocked position. The track 326 can have one end corresponding to the locked position and an opposite end corresponding to the unlocked position. A track engagement arm 329 can extend from the sliding element 304 toward the track 326. The track engagement arm 329 can have a tab received within the track 326 and configured to guide the sliding element 304 along the track 326. In some instances, the track engagement arm 329 and the tab can couple the spring guide tube 325 with the sliding element 304, and the tab coupled with the spring guide tube 325 being utilized to compress the biasing element 306 as the locking mechanism transitions from the locked position to the unlocked position.

As the sliding element 304 transitions from the locked position to the unlocked position, the track engagement arm and corresponding protrusion moves from one end of the track 326 to the opposing end, and the biasing element 306 is compressed. The track 326 can be a groove having a predetermined depth but not extending through the base 302. In some embodiments, the track 326 can be formed in the upper surface of the spring receiving portion 324, thereby allowing the track engaging tab to extend directly from the sliding element 304 and eliminating the track engagement arms 329.

The sliding element 304 can be transitioned between the locked position and the unlocked position. The unlocked position can be seen more clearly in FIG. 8, while the locked position can be seen clearly in FIGS. 3A and 3B. The biasing element 306 can hold the locking mechanism 300 in the locked position. The unlocked position can have the protrusion 308 displaced toward a support 328 of the base 302 relative to the locked position. As can be appreciated with respect to FIGS. 6-9 (discussed in more detail below), the unlocked position displaces the sliding element 304 and the protrusion 308 so as to allow a component card 806 to be coupled and/or decoupled from the locking mechanism.

Figure 4B:
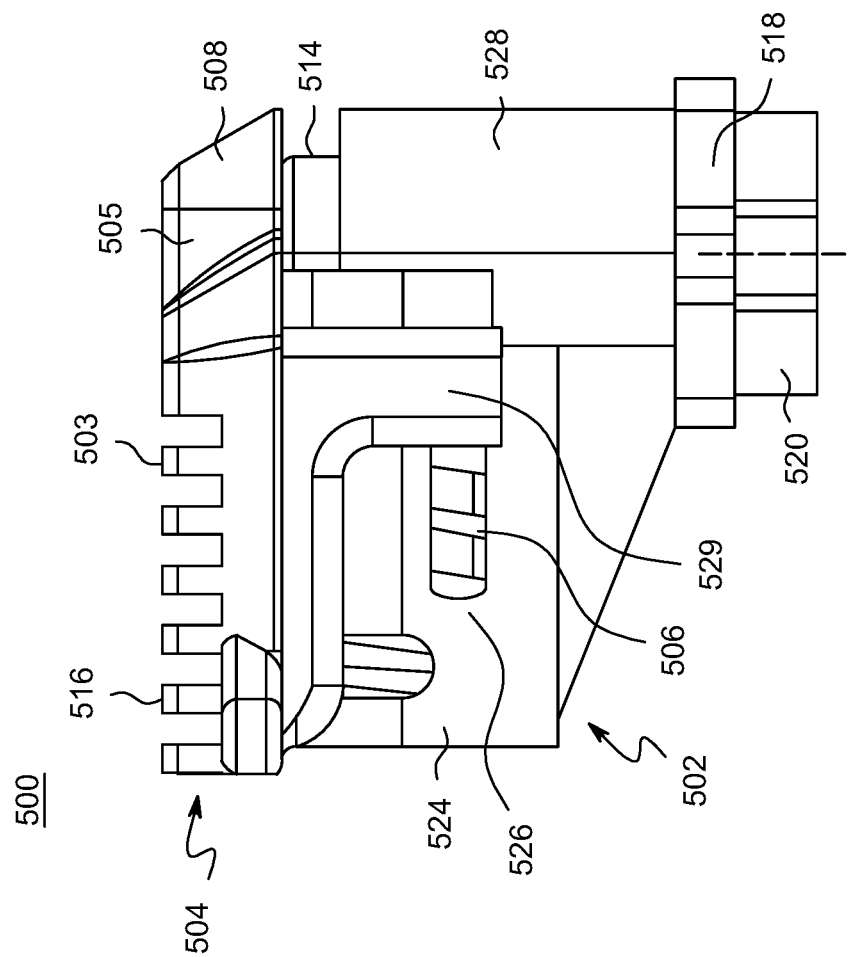
FIG. 4B is a side view of the example embodiment of a locking mechanism of FIG. 4A.

FIGS. 4A, 4B, and 4C illustrate an example embodiment of a locking mechanism 500 according to the present disclosure. The locking mechanism 500 can have a base 502, a sliding element 504, and a biasing element 506 located within the base 502. The sliding element 504 can be slidably disposed on the base 502, and has a protrusion 508 extending therefrom. The protrusion 508 can be a portion of the sliding element 504 that extends in one direction. The sliding element 504 can also include a top surface 503 with a beveled edge 505. The base 502 can have a coupling portion 518 configured to secure the locking mechanism 500 to a main board (not shown). This is discussed in greater detail with respect to FIGS. 6-9.

The sliding element 504 can be transitioned between a locked position and an unlocked position. The biasing element 506 located within the base 502 can hold the locking mechanism 500 in the locked position. The unlocked position can have the protrusion 508 displaced toward a support 528 of the base 502 relative to the locked position. As can be appreciated in FIG. 4B, a bottom surface of the protrusion 508 and a top surface of the base 502 can collectively form a receiving portion 514. The receiving portion 514 can have be configured to receive a notch of a component card (as discussed below with respect to FIGS. 6-9).

The locking mechanism 500 can also have a handle portion 516 formed on the sliding element 504 and disposed opposite the protrusion 508. The handle portion 516 can assist in transitioning the locking mechanism 500 between the locked position and the unlocked position. The handle portion 516 can be operably engaged to guide the sliding element 504 while simultaneously compressing the biasing element 506 located within the base 502 to transition the locking mechanism 500 between the locked position and the unlocked position. The beveled edge 505 of the sliding element 504 can be configured to transition the locking mechanism 500 to an unlocked position as a component card (as discussed below in greater detail with respect to FIG. 6) abuts the beveled edge 505. The component card can abut the beveled edge 505, causing the component card to slide down the beveled edge 505. This contact causes the sliding element 504 to apply a force against biasing element 506 biasing element 506. The force then compresses the biasing element 506, and thus the locking mechanism 500 transitions from the locked position to the unlocked position. This is discussed in greater detail with respect to FIG. 7. The beveled edge 505 can be a beveled portion, or sloped portion disposed on the protrusion 508. In some embodiments of the disclosure, the sliding element 504 can have a handle portion 516, a slanted portion, or any combination thereof.

The biasing element 506 located within the base 502 can configured to urge the sliding element 504 toward a locked position. Specifically, a spring receiving portion 524 can be disposed within the base 502 to receive the biasing element 506. Compression of the biasing element 506 by sliding of the sliding element 504 can transition the locking mechanism 500 to an unlocked position. The base 502 furthers include a coupling portion 518 engageable with a main board (as discussed below in greater detail with respect to FIGS. 6-9). The coupling portion 518 and the base 502 can be formed as a unibody structure reducing the costs for manufacture and design. The coupling portion 518 can have a plurality of securing elements 520 configured to be disposed through a corresponding number of apertures (not shown) formed on the main board (as discussed below in greater detail with respect to FIGS. 6-9).

The securing elements 520 and the corresponding apertures (not shown) can have corresponding circumferences (where the aperture is slightly larger) that allows for a perfect fit between the parts. In other embodiments, the securing elements 520 and the apertures (not shown) can have an interference fit—where the condition of fit (contact) between the two parts requires pressure to force the parts together. The coupling portion 518 can extend from the securing elements 520 such that it is configured to abut and engage a top surface of the main board 802 when the displaceable elements 520 are disposed through the corresponding apertures. The coupling portion 518 can secure the locking mechanism 500 to the main board, thereby allowing the component card to received and secured by the locking mechanism 500.

The biasing element 506 can be disposed between the base 502 and the sliding element 504 and configured to urge the sliding element 504 toward a locked position. Compression of the biasing element 506 by sliding of the sliding element 504 can transition the locking mechanism 500 to an unlocked position. In at least one embodiment, the biasing element 506 is a spring. A spring receiving portion 524 can be disposed within the base 502 and configured to receive a spring biasing element 506. The spring biasing element 506 can be coupled with the sliding element 504. The spring receiving portion 524 can be a protuberance extending opposite the protrusion 508 and configured to receive the spring therein. The sliding element 504 can have a spring guide tube 525 received within the spring receiving portion 524 and around which the biasing element 506 can be disposed. The spring guide tube 525 and the spring receiving portion 524 can form an annulus within which the biasing element 506 is received. The spring guide tube 525 can allow smooth compression and expansion of the biasing element 506, while preventing the biasing element 506 of compressing or deflecting in a direction inconsistent with transitioning of the locking mechanism 500 between the locked and unlocked position.

The base 502 can have at least a portion of the sliding element 504 received within a track 526 allowing the sliding element 504 to transition on the base 502 between the locked position and the unlocked position. The track 526 can have one end corresponding to the locked position and an opposing end corresponding to the unlocked position. A track engagement arm 529 can extend from the sliding element 504 toward the track 526. The track engagement arm 529 can have a tab received within the track 526 and configured to guide the sliding element 504 along the track 526. In some instances, the track engagement arm 529 and the tab can couple the spring guide tube 525 with the sliding element 504. The tab coupled with the spring guide tube 525 is utilized to compress the biasing element 506 as the locking mechanism transitions from the locked position to the unlocked position.

As the sliding element 504 transitions from the locked position to the unlocked position, the track engagement arm and corresponding protrusion moves from one end of the track 526 to the opposing, end and the biasing element 506 is compressed. The track 526 can be an elongated aperture formed in a portion of the base 502, such as the spring receiving portion 524. In alternative embodiments, the track 526 can be a groove having a predetermined depth but not extending through the base 502. In some embodiments, the track 526 can be formed in the upper surface of the spring receiving portion 524, thereby allowing the track engaging tab to extend directly from the sliding element 504 and eliminating the track engagement arms 529.

The sliding element 504 can be transitioned between the locked position and the unlocked position. The unlocked position can be seen more clearly in FIG. 8, while the locked position can be seen clearly in FIGS. 4A and 4B. The biasing element 506 can hold the locking mechanism 500 in the locked position. The unlocked position can have the protrusion 508 displaced toward a support 528 of the base 502 relative to the locked position. As can be appreciated with respect to FIGS. 6-9, discussed in more detail below, the unlocked position displaces the sliding element 504 and the protrusion 508 so as to allow a component card to be coupled and/or decoupled from the locking mechanism.

As shown in FIG. 4C, the locking mechanism 500 is provided in a base-rear isometric exploded view. The sliding element 504 can have a spring guide tube 525 received within the spring receiving portion 524 and around which the biasing element 506 can be disposed. The spring receiving portion 524 can have an aperture 531 in the back surface 533 allowing the spring guide tube 525 to extend through as the sliding element 504 is transitioned to the unlocked position. The aperture 531 allows for quick access to the spring receiving portion 524 for repairs and installation. Moreover, the aperture 531 allows for simplicity in manufacturing the components of the locking mechanism 500. In at least one embodiment, the protuberance is a hollow tube having a coil spring received within the tube.

Figure 5A:
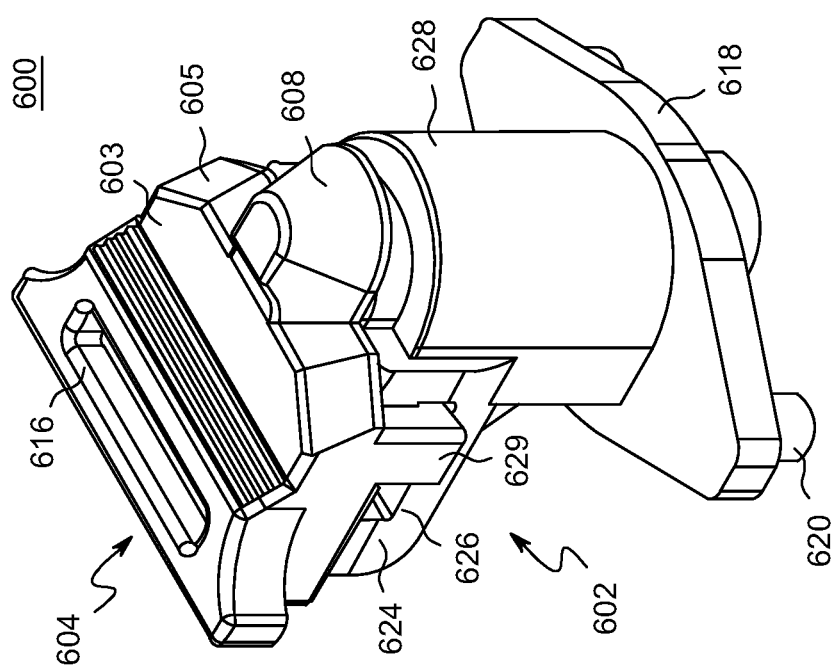
FIG. 5A is an isometric view of an example embodiment of a locking mechanism in accordance with the present disclosure.
Figure 5B:
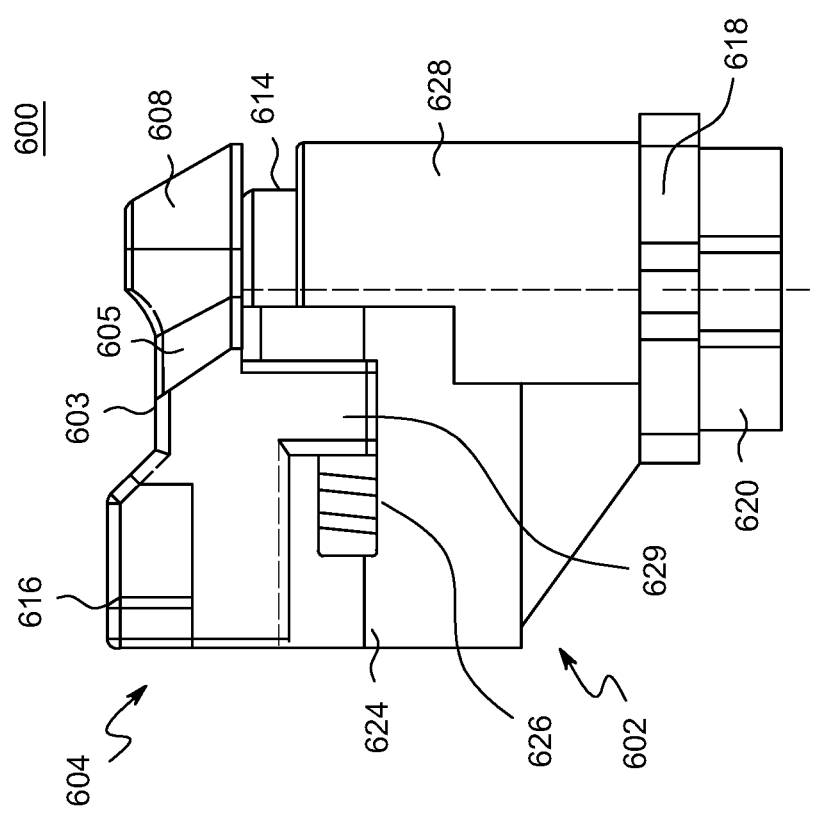
FIG. 5B is a side view of the example embodiment of a locking mechanism of FIG. 6A.
Figure 5C:
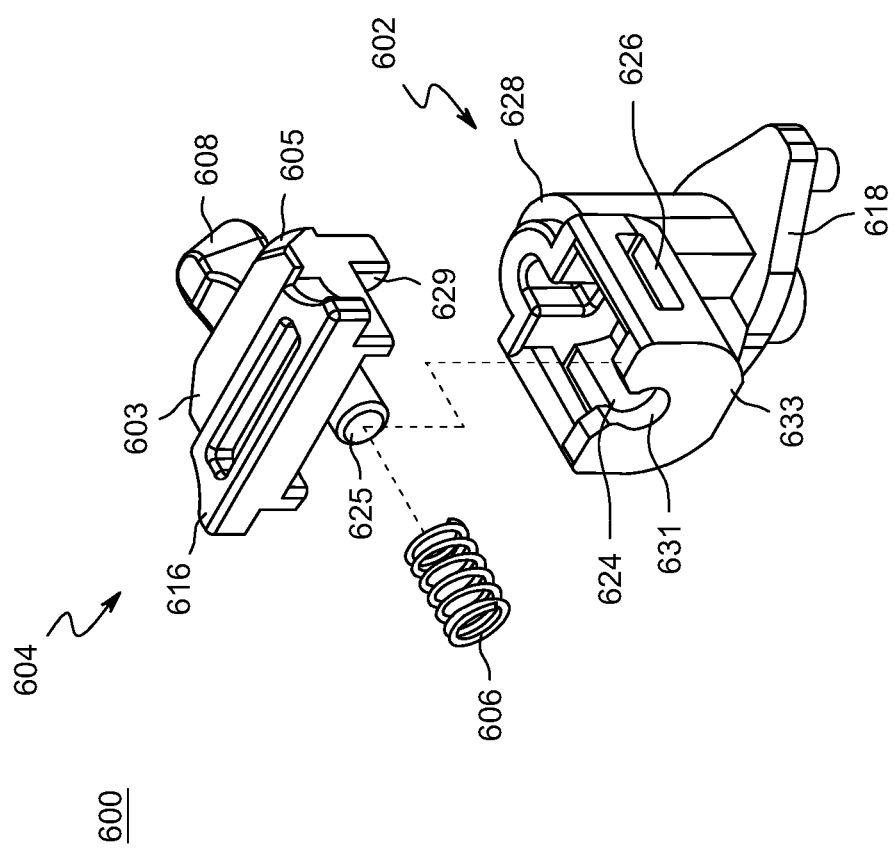
FIG. 5C is a base-rear isometric exploded view of the example embodiment of a locking mechanism of FIG. 5A.

FIGS. 5A, 5B, and 5C illustrate an example embodiment of a locking mechanism 600 according to the present disclosure. The locking mechanism 600 can have a base 602, a sliding element 604, and a biasing element 606 located within the base 602. The sliding element 604 can be slidably disposed on the base 602, and has a protrusion 608 extending therefrom. The protrusion 608 can be a portion of the sliding element 604 that extends in one direction. The sliding element 604 can also include a top surface 603 with a beveled edge 605. The base 602 can have a coupling portion 618 configured to secure the locking mechanism 600 to a main board (not shown). This is discussed in greater detail with respect to FIGS. 6-9.

The sliding element 604 can be transitioned between a locked position and an unlocked position. The biasing element 606 located within the base 602 can hold the locking mechanism 600 in the locked position. The unlocked position can have the protrusion 608 displaced toward a support 628 of the base 602 relative to the locked position. As can be appreciated in FIG. 5B, a bottom surface of the protrusion 608 and a top surface of the base 602 can collectively form a receiving portion 614. The receiving portion 614 can have be configured to receive a notch of a component card as discussed below with respect to FIGS. 6-9.

The locking mechanism 600 can also have a handle portion 616 formed on the sliding element 604 and disposed opposite the protrusion 608. The handle portion 616 can assist in transitioning the locking mechanism 600 between the locked position and the unlocked position. The handle portion 616 can be operably engaged to guide the sliding element 604 while simultaneously compressing the biasing element 606 located within the base 602 to transition the locking mechanism 600 between the locked position and the unlocked position. The beveled edge 605 of the sliding element 604 can be configured to transition to the locking mechanism 600 to an unlocked position as a component card (as discussed below in greater detail with respect to FIG. 6) abuts the beveled edge 605. The component card can abut the beveled edge 605, causing the component card to slide down the beveled edge 605. This contact causes the sliding element 604 to apply a force against biasing element 606. The force then compresses the biasing element 606 and thus the locking mechanism 600 transitions from the locked position to the unlocked position. This is discussed in greater detail with respect to FIG. 7. The beveled edge 605 can be a beveled portion, or sloped portion disposed on the protrusion 608. In some embodiments of the disclosure, the sliding element 604 can have a handle portion 616, a slanted portion, or any combination thereof.

The biasing element 606 located within the base 602 can configured to urge the sliding element 604 toward a locked position. Specifically, a spring receiving portion 624 can be disposed within the base 602 to receive the biasing element 606. Compression of the biasing element 606 by sliding of the sliding element 604 can transition the locking mechanism 600 to an unlocked position. The base 602 further includes a coupling portion 618 engageable with a main board (as discussed below in greater detail with respect to FIGS. 6-9). The coupling portion 618 and the base 602 can form a unibody structure, thereby reducing the costs for manufacture and design. The coupling portion 618 can have a plurality of securing elements 620 configured to be disposed through a corresponding number of apertures (not shown) formed on the main board (as discussed below in greater detail with respect to FIGS. 6-9).

The securing elements 620 and the corresponding apertures (not shown) can have corresponding circumferences (where the aperture is slightly larger) that allows for a perfect fit between the parts. In other embodiments, the securing elements 620 and the apertures (not shown) can have an interference fit—where the condition of fit (contact) between the two parts requires pressure to force the parts together. The coupling portion 618 can extend from the securing elements 620 such that it is configured to abut and engage a top surface of the main board 802 when the displaceable elements 620 are disposed through the corresponding apertures. The coupling portion 618 can secure the locking mechanism 600 to the main board, thereby allowing the component card to received and secured by the locking mechanism 600.

The biasing element 606 can be disposed between the base 602 and the sliding element 604 and configured to urge the sliding element 604 toward a locked position. Compression of the biasing element 606 by sliding of the sliding element 604 can transition the locking mechanism 600 to an unlocked position. In at least one embodiment, the biasing element 606 is a spring. A spring receiving portion 624 can be disposed within the base 602 and configured to receive a spring biasing element 606. The spring biasing element 606 can be coupled with the sliding element 604. The spring receiving portion 624 can be a protuberance extending opposite the protrusion 608 and configured to receive the spring therein. The sliding element 604 can have a spring guide tube 625 received within the spring receiving portion 624 and around which the biasing element 606 can be disposed. The spring guide tube 625 and the spring receiving portion 624 can form an annulus within which the biasing element 606 is received. The spring guide tube 625 can allow smooth compression and expansion of the biasing element 606, while preventing the biasing element 606 of compressing or deflecting in a direction inconsistent with transitioning of the locking mechanism 600 between the locked and unlocked position.

The spring receiving portion 624 can have an aperture 631 in the back surface 633 allowing the spring guide tube 625 to extend through as the sliding element 604 is transitioned to the unlocked position. The aperture 631 allows for quick access to the spring receiving portion 624 for repairs and installation. Moreover, the aperture 631 allows for simplicity in manufacturing the components of the locking mechanism 600. In at least one embodiment, the protuberance is a hollow tube having a coil spring received within the tube.

The base 602 can have at least a portion of the sliding element 604 received within a track 626 allowing the sliding element 604 to transition on the base 602 between the locked position and the unlocked position. The track 626 can have one end corresponding to the locked position and an opposing end corresponding to the unlocked position. A track engagement arm 629 can extend from the sliding element 604 toward the track 626. The track engagement arm 629 can have a tab received within the track 626 and configured to guide the sliding element 604 along the track 626. In some instances, the track engagement arm 629 and the tab can couple the spring guide tube 625 with the sliding element 604, and the tab coupled with the spring guide tube 625 being utilized to compress the biasing element 606 as the locking mechanism transitions from the locked position to the unlocked position.

As the sliding element 604 transitions from the locked position to the unlocked position, the track engagement arm and corresponding protrusion moves from one end of the track 626 to the opposing end and the biasing element 606 is compressed. The track 626 can be an elongated aperture formed in a portion of the base 602, such as the spring receiving portion 624. In alternative embodiments, the track 626 can be a groove having a predetermined depth but not extending through the base 602. In some embodiments, the track 626 can be formed in the upper surface of the spring receiving portion 624, thereby allowing the track engaging tab to extend directly from the sliding element 604 and eliminating the track engagement arms 629.

The sliding element 604 can be transitioned between the locked position and the unlocked position. The unlocked position can be seen more clearly in FIG. 8, while the locked position can be seen clearly in FIGS. 5A and 5B. The biasing element 606 can hold the locking mechanism 600 in the locked position. The unlocked position can have the protrusion 608 displaced toward a support 628 of the base 602 relative to the locked position. As can be appreciated with respect to FIGS. 6-9(discussed in more detail below), the unlocked position displaces the sliding element 604 and the protrusion 608 so as to allow a component card 806 to be coupled and/or decoupled from the locking mechanism.

Figure 6:
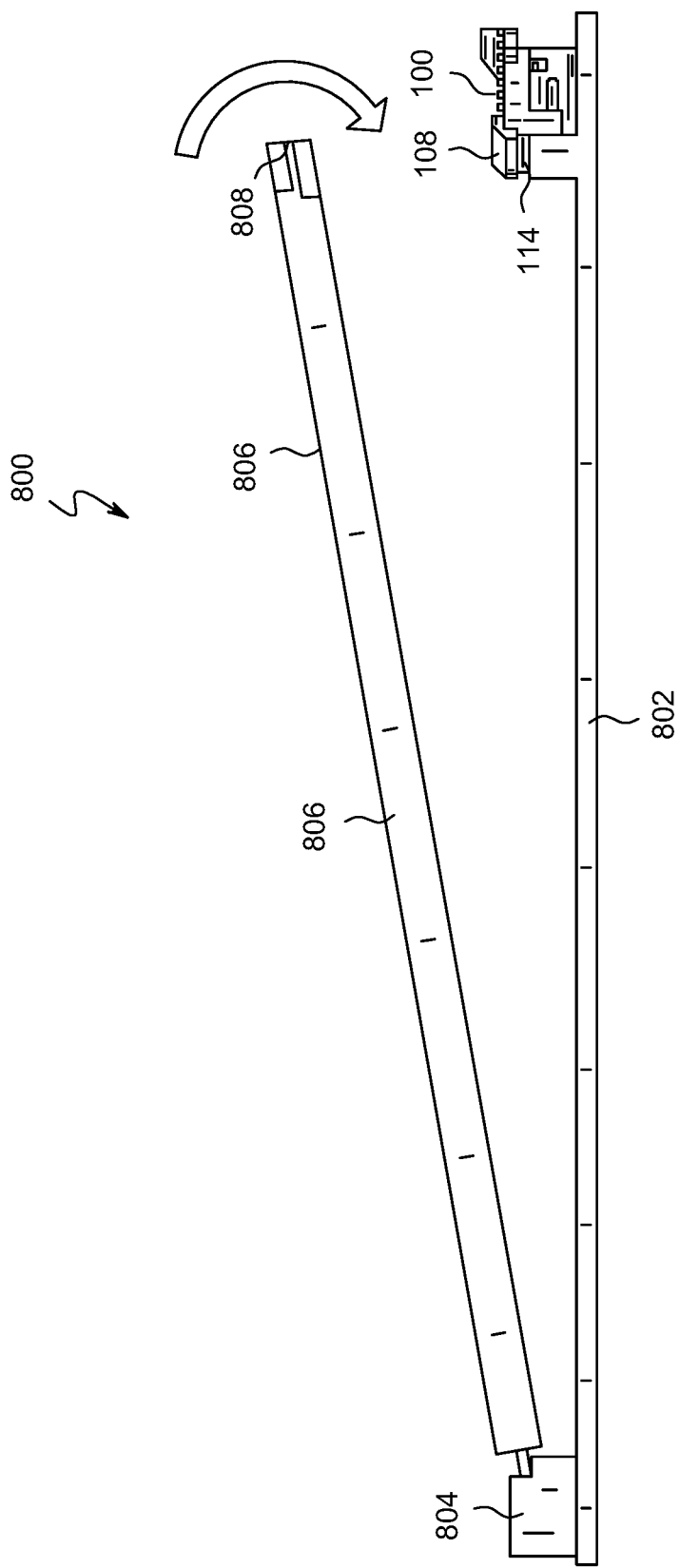
FIG. 6 is a diagrammatic view of a component board receiving a component card in accordance with the present disclosure.

FIG. 6 illustrates an example component board 800 configured to receive an exemplary locking mechanism coupled with a main board 802. It should be noted, for the purposes of this demonstrative, locking mechanisms 100-600 described herein, can be implemented to secure the main board 802 to the component board 800. The main board 802 can have a locking mechanism 100 and a corresponding component coupler 804 at a predetermined distance and configured to receive a component card 806 therein. The component card 806 can have the notch 808 formed at a first end and disposed adjacent to the locking mechanism 100 when the component card 806 is coupled with the main board 802. The notch 808 can be configured to be received in the receiving portion 114 and abut the protrusion 108, thereby securing the component card 806 to the main board 802. A second end of the component card 806 is received in the component coupler 804, thus securing the component card 806 to the main board 802. The biasing element 106 urges the sliding element toward the locked position retaining the notch 808 within the receiving portion 114. The notch 808 is abutted by the top surface of the base 102 and the bottom surface of the protrusion 108, thus preventing removal of the component card 806.

The illustrated embodiments are drawn to a component board 800 and locking mechanism configured to receive and secure a M.2 component card. The notch 808 is substantially semi-circular and configured to receive the beveled edge 105 on the base 104 and is secured by substantially semi-circular protrusion. While the illustrated embodiments are drawn to a locking mechanism 100 configured to secure a M.2 component card, it is within the scope of the disclosure to implement the locking mechanism 100 with various components which may require varying shapes and sizes of the receiving portion 114, shape and/or of the beveled edge 105, shape and/or size of the protrusion 108, or any combination thereof. FIG. 6 also illustrates the process for adding the component card 806 into the component board 800. A first end of the component card 806 can be first coupled with the component coupler 804 of component board 804. The second end of the component card 806 can be then pivoted about the component coupler 804 toward the locking mechanism 100. The second end can be configured to engage the locking mechanism 100, as can be more clearly appreciated in FIG. 7.

Figure 7:
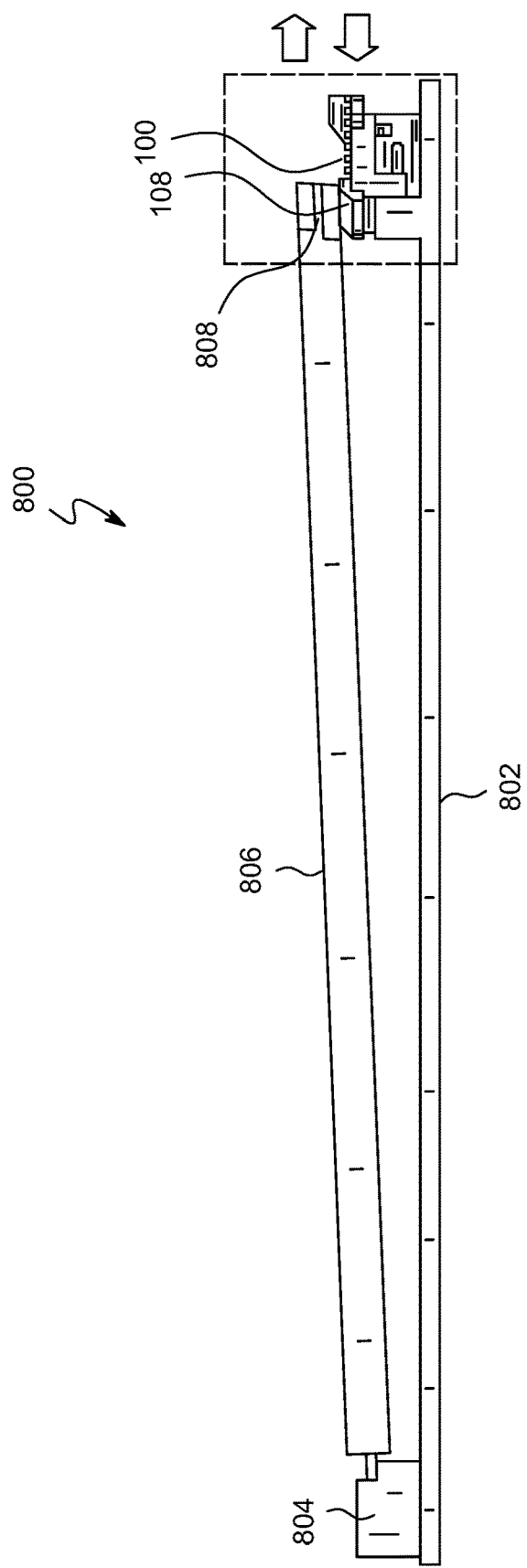
FIG. 7 is a diagrammatic view of a locking mechanism coupling with a component card in accordance with the present disclosure.

FIG. 7 illustrates the process of the second end of the component card 806 being engaged by the locking mechanism 100. As discussed above with respect to FIG. 1C, the biasing element 106 urges the locking mechanism 100 to the default, locked position. However, as the component card 806 is pivoted toward the locking mechanism 100, the notch 808 on the component card 806 engages the beveled edge 105 of the protrusion 108 on the locking mechanism 100. This contact causes the sliding portion 104 to apply a force against biasing element 106. The force then compresses the biasing element 106, and thus the locking mechanism 100 transitions from the locked position to the unlocked position. In the unlocked position (as discussed above), the protrusion 108 is displaced rearward toward the support 128 with respect to the base 102. Displacement of the protrusion 108 allows the notch 808 of the component card 806 to be received within the receiving portion 114 of the locking mechanism 100. Upon receipt of the notch 808 within the receiving portion 114, the notch 808 slides past the protrusion 808 and thus no force is applied against sliding element 104 and the biasing element 106. In the absence of such force, the locking mechanism 100 returns to the locked position as the biasing element 106 urges the sliding element 104 forward towards the component card 806.

It should be noted that the disclosure also contemplate that the protrusion 108 may not have a beveled edge 105. In such configurations, a user would apply the necessary force to the sliding portion 104, via handle portion 116, to transition to the unlocked position, and release the handle portion 116 once the notch 808 is in the receiving portion 114.

Figure 8:
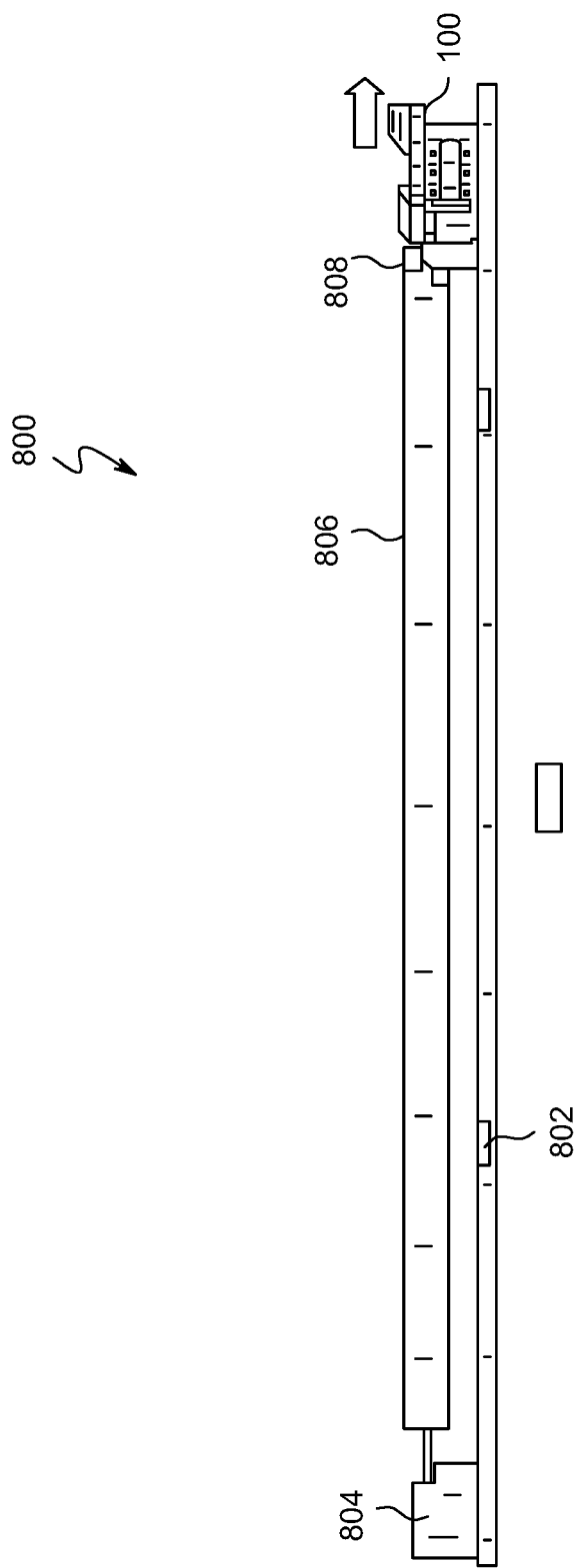
FIG. 8 is a diagrammatic view of a locking mechanism releasing a component card in accordance with the present disclosure.
Figure 9:
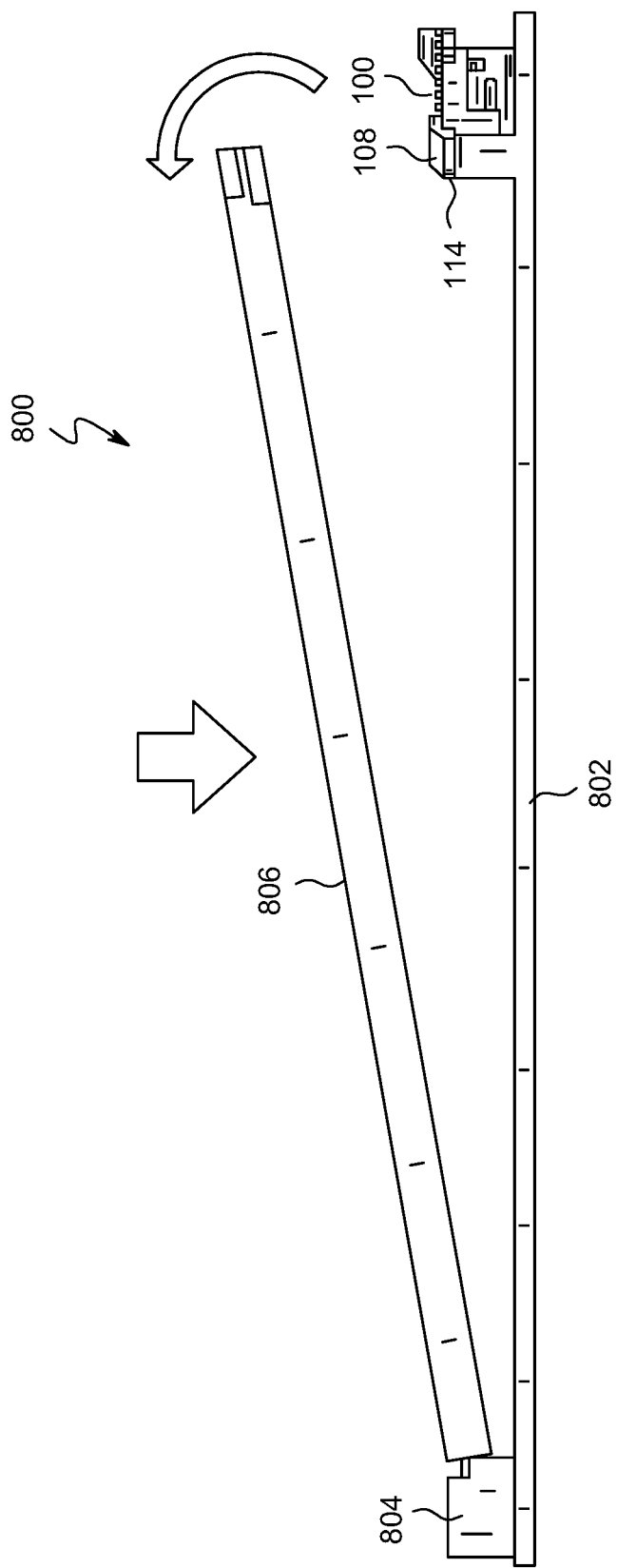
FIG. 9 is a diagrammatic view of a component board releasing a component card in accordance with the present disclosure.

The process for removing the component card 806 is illustrated in FIGS. 8 and 9. FIG. 8 illustrates a component card 806 being decoupled from the component board 800 and unsecured from the main board 802 by transitioning the locking mechanism 100 from the locked position to the unlocked position. The notch 808 of the component card 806 is received within the receiving portion 114 of the locking mechanism 100 and the locking mechanism 100 is retained in the locked position by the biasing element 106. A force is applied to the sliding element 104 thereby compressing the biasing element 106. As the biasing element 106 compresses, the sliding element 104 and the protrusion 108 are displaced toward the support 128, and the bottom surface of the protrusion 108 is removed from the notch 808. The component car 806 is free to be displaced from the locking mechanism 100 and decoupled from the main board 802.

FIG. 9 illustrates a component card 806 releasing from a component board 800. The compression of the biasing element (not shown) translates the sliding element (not shown) and disengages the protrusion 108 from the notch 808 releasing the component card 806. The component card 806 can be pivoted about the component coupler 804 and disengaged from the main board 802 and removed from the component board 800. Each component card 806 can be individually coupled and decoupled from the main board 802 by transitioning the appropriate locking mechanism 100 corresponding to the respective component card 806.

It is believed that the exemplary embodiment and its advantages will be understood from the foregoing description. It will be apparent that various changes may be made thereto without departing from the spirit and scope of the disclosure or sacrificing all of its advantages the examples hereinbefore described merely being preferred or exemplary embodiments of the disclosure.

What is claimed is:

1. A locking mechanism configured to secure a component card to a main board, the locking mechanism comprising:
   a base having a top portion and a coupling portion engageable with the main board;
   a sliding element slidably coupled to the base, the sliding element having a protrusion extending therefrom and a beveled edge, wherein the sliding element is slidable between a locked position and an unlocked position, the unlocked position having the protrusion displaced towards the base relative to the locked position; and
   a biasing element disposed between the base and the sliding element within a protuberance extending opposite the protrusion, the biasing element urging the sliding element toward the locked position, wherein the protuberance comprising an aperture formed at an end opposite the protrusion and configured to allow at least a portion of the biasing element to extend through as the sliding element is transitioned to the unlocked position, wherein the protuberance comprises a spring receiving portion disposed within the base, wherein the sliding element has a spring guide disposed within the spring receiving portion forming an annulus between the spring guide and the spring receiving portion, and the spring disposed within annulus and coupled with the sliding element;
   wherein the base and the sliding element are arranged so that in the locked position, a bottom surface of the protrusion and a top surface of the base define a receiving space.

2. The locking mechanism of claim 1, further comprising a handle portion formed on the sliding element opposite the protrusion, the handle portion configured to assist sliding between the locked position and the unlocked position.

3. The locking mechanism of claim 1, wherein the coupling portion comprises at least one securing element configured to be disposed through an aperture formed in the main board, the securing element forming a pressure fit with the aperture.

4. The locking mechanism of claim 3, wherein the coupling portion has a tab extending therefrom configured to abut a top surface of the main board as the securing element is disposed through an aperture formed in the main board.

5. The locking mechanism of claim 1, wherein the aperture formed at the end opposite the protrusion is configured to allow at least a portion of the spring guide to pass through.

6. The locking mechanism of claim 1, wherein the component card is an M.2 card having a substantially semicircular notch, the notch receivable into a correspondingly shaped receiving space defined between the sliding element and the base.

7. The locking mechanism of claim 1, wherein the sliding element comprises at least one tab configured to engage with a track formed on the base, one end of the track corresponding to the locked position and another end opposite the one end corresponding to the unlocked position.

8. A component board comprising:
   at least one locking mechanism comprising:
   a base having a top portion and a coupling portion engageable with the component board;
   a sliding element slidably coupled to the base, the sliding element having a protrusion extending therefrom and a beveled edge, wherein the sliding element is slidable between a locked position and an unlocked position, the unlocked position having the protrusion displaced towards the base relative to the locked position; and
   a biasing element disposed between the base and the sliding element within a protuberance extending opposite the protrusion, the biasing element urging the sliding element toward the locked position, wherein the protuberance comprising an aperture formed at an end opposite the protrusion and configured to allow at least a portion of the biasing element to extend through as the sliding element is transitioned to the unlocked position, wherein the protuberance comprises a spring receiving portion disposed within the base, wherein the sliding element has a spring guide disposed within the spring receiving portion forming an annulus between the spring guide and the spring receiving portion, and the spring disposed within annulus and coupled with the sliding element;
   wherein the base and the sliding element are arranged so that in the locked position a bottom surface of the protrusion and a top surface of the base define a receiving space.

9. The component board of claim 8, further comprising a handle portion formed on the sliding element opposite the protrusion, the handle portion configured to assist sliding between the locked position and the unlocked position.

10. The component board of claim 8, wherein the coupling portion comprises at least one securing element configured to be disposed through an aperture formed in a main board, the securing element forming a pressure fit with the aperture.

11. The component board of claim 10, wherein the coupling portion has a tab extending therefrom configured to abut a top surface of the main board as the securing element is disposed through an aperture formed in the main board.

12. The component board of claim 8, wherein the aperture formed at the end opposite the protrusion is configured to allow at least a portion of the spring guide to pass through.

13. The component board of claim 8, wherein the component card is an M.2 card having a substantially semicircular notch, the notch receivable into a correspondingly shaped receiving space defined between the sliding element and the base.

14. The component board of claim 8, wherein the sliding element comprises at least one tab configured to engage with a track formed on the base, one end of the track corresponding to the locked position and another end opposite the one end corresponding to the unlocked position.

15. A locking mechanism configured to secure a component card to a main board, the locking mechanism comprising:
   a base having a top portion and a coupling portion engageable with the main board;
   a sliding element slidably coupled to the base, the sliding element having a protrusion extending therefrom and a beveled edge, wherein the sliding element is slidable between a locked position and an unlocked position, the unlocked position having the protrusion displaced towards the base relative to the locked position, wherein the sliding element comprises at least one tab configured to engage with a track formed on the base, one end of the track corresponding to the locked position and another end opposite the one end corresponding to the unlocked position; and
   a biasing element disposed between the base and the sliding element within a protuberance extending opposite the protrusion, the biasing element urging the sliding element toward the locked position, wherein the protuberance comprising an aperture formed at an end opposite the protrusion and configured to allow at least a portion of the biasing element to extend through as the sliding element is transitioned to the unlocked position,
   wherein the base and the sliding element are arranged so that in the locked position, a bottom surface of the protrusion and a top surface of the base define a receiving space.

16. A component board comprising:
   at least one locking mechanism comprising:
   a base having a top portion and a coupling portion engageable with the component board;
   a sliding element slidably coupled to the base, the sliding element having a protrusion extending therefrom and a beveled edge, wherein the sliding element is slidable between a locked position and an unlocked position, the unlocked position having the protrusion displaced towards the base relative to the locked position, wherein the sliding element comprises at least one tab configured to engage with a track formed on the base, one end of the track corresponding to the locked position and another end opposite the one end corresponding to the unlocked position; and
   a biasing element disposed between the base and the sliding element within a protuberance extending opposite the protrusion, the biasing element urging the sliding element toward the locked position, wherein the protuberance comprising an aperture formed at an end opposite the protrusion and configured to allow at least a portion of the biasing element to extend through as the sliding element is transitioned to the unlocked position,
   wherein the base and the sliding element are arranged so that in the locked position a bottom surface of the protrusion and a top surface of the base define a receiving space.

* * * * *